US008664675B2

(12) United States Patent
Huang et al.

(10) Patent No.: US 8,664,675 B2
(45) Date of Patent: Mar. 4, 2014

(54) MULTICHIP LIGHT-EMITTING DIODE HAVING MULTIPLE LENSES

(75) Inventors: Tien-Fu Huang, Baoshan Township (TW); Shih-Hao Hua, Sihu Township (TW)

(73) Assignee: Industrial Technology Research Institute, Hsinchu (TW)

( * ) Notice: Subject to any disclaimer, the term of this patent is extended or adjusted under 35 U.S.C. 154(b) by 474 days.

(21) Appl. No.: 12/412,787

(22) Filed: Mar. 27, 2009

(65) Prior Publication Data

US 2010/0155745 A1    Jun. 24, 2010

(30) Foreign Application Priority Data

Dec. 24, 2008   (TW) ............................... 97150508 A

(51) Int. Cl.
  H01L 33/00   (2010.01)
  H01L 31/0203 (2006.01)
  F21V 7/04    (2006.01)

(52) U.S. Cl.
  USPC .............. 257/98; 257/100; 257/433; 362/555

(58) Field of Classification Search
  USPC ........................................................ 257/433
  See application file for complete search history.

(56) References Cited

U.S. PATENT DOCUMENTS

| | | | | |
|---|---|---|---|---|
| 6,479,942 B2* | 11/2002 | Kimura | ...................... | 315/169.3 |
| 6,998,647 B2* | 2/2006 | Morimoto et al. | ............... | 257/99 |
| 7,347,603 B2* | 3/2008 | Ikeda et al. | .................... | 362/555 |
| 7,564,180 B2* | 7/2009 | Brandes | ........................ | 313/501 |
| 2005/0218468 A1 | 10/2005 | Owen et al. | | |
| 2005/0236639 A1* | 10/2005 | Abe et al. | ........................ | 257/100 |
| 2006/0065957 A1* | 3/2006 | Hanya | ............................... | 257/676 |
| 2006/0138436 A1* | 6/2006 | Chen et al. | ....................... | 257/98 |
| 2006/0146516 A1* | 7/2006 | Li et al. | ............................ | 362/84 |
| 2006/0186425 A1* | 8/2006 | Yano et al. | ....................... | 257/98 |
| 2006/0239002 A1* | 10/2006 | Chou et al. | ..................... | 362/249 |
| 2007/0030676 A1* | 2/2007 | Ichihara | ......................... | 362/244 |
| 2007/0075325 A1 | 4/2007 | Baek et al. | | |
| 2007/0297171 A1 | 12/2007 | Berben et al. | | |
| 2008/0084709 A1 | 4/2008 | Li et al. | | |
| 2008/0111141 A1 | 5/2008 | Li et al. | | |
| 2008/0137333 A1* | 6/2008 | Tamaoki et al. | ............... | 362/244 |
| 2010/0078663 A1* | 4/2010 | Shi et al. | ......................... | 257/98 |

FOREIGN PATENT DOCUMENTS

| CN | 1855480 A | 11/2006 |
|---|---|---|
| TW | 568358 | 12/2003 |
| TW | M260875 U | 4/2005 |
| TW | M270497 | 7/2005 |

(Continued)

OTHER PUBLICATIONS

Office Action from China for Application No. 200910003072.0 dated Mar. 15, 2011; SIPO.

(Continued)

*Primary Examiner* — Michael Jung
(74) *Attorney, Agent, or Firm* — Stevens & Showalter LLP

(57) ABSTRACT

A multichip light-emitting diode (LED) includes a reflective cup, a plurality of light-emitting chips and a package. The light-emitting chips are disposed in the reflective cup and emit light when driven. The package is disposed in the reflective cup and covers the light-emitting chips. The package further has a plurality of lenses corresponding to the light-emitting chips one by one. The lenses refract light emitted by the corresponding light-emitting chips, respectively. An extrinsic light efficiency of the multichip is increased through the design of the multichip LED.

9 Claims, 17 Drawing Sheets

(56) References Cited

FOREIGN PATENT DOCUMENTS

| TW | I237406 | 8/2005 |
| TW | M294718 | 7/2006 |
| TW | 200640047 | 11/2006 |
| TW | I285966 B | 8/2007 |
| TW | M333027 | 5/2008 |
| TW | 200841481 | 10/2008 |

OTHER PUBLICATIONS

Office Action for Application No. 097150508 dated Oct. 16, 2012; TIPO.

\* cited by examiner

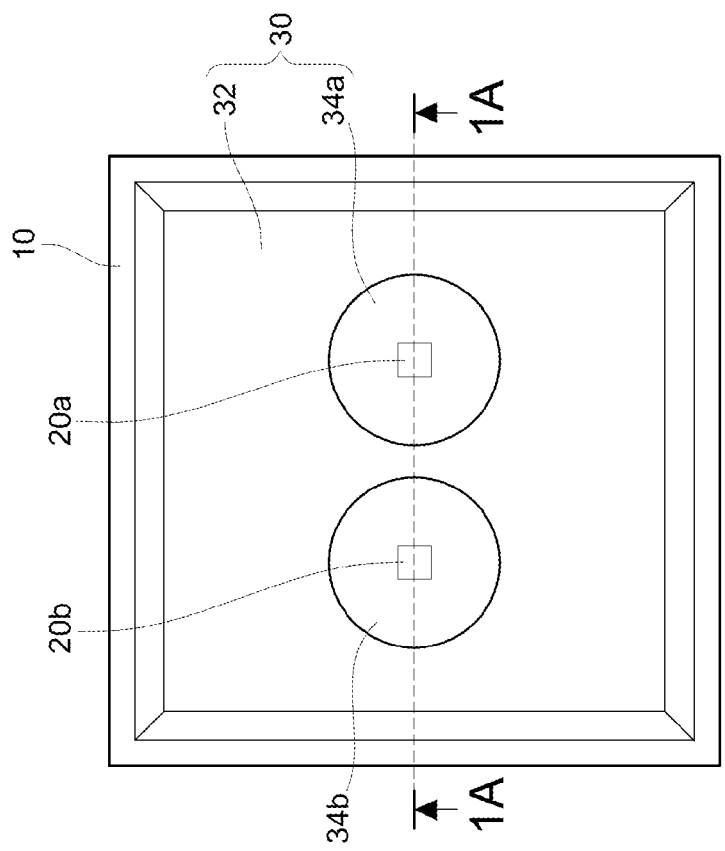
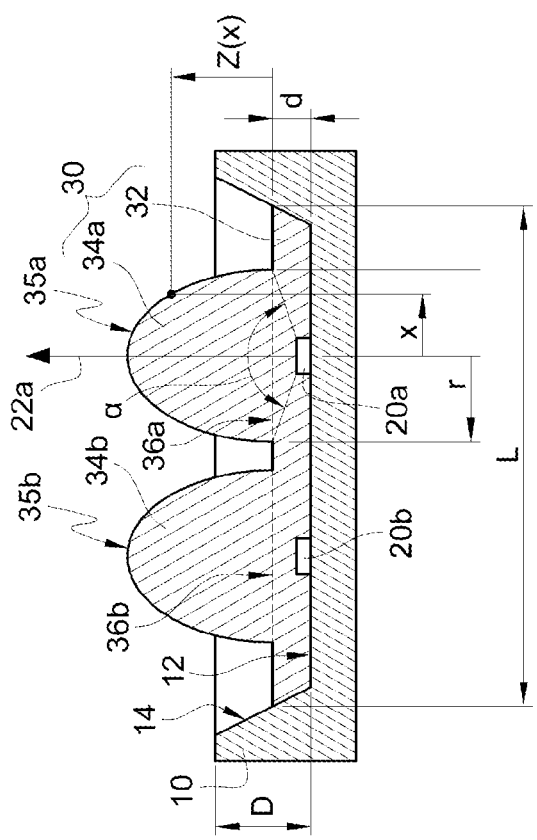
FIG.1B
FIG.1A

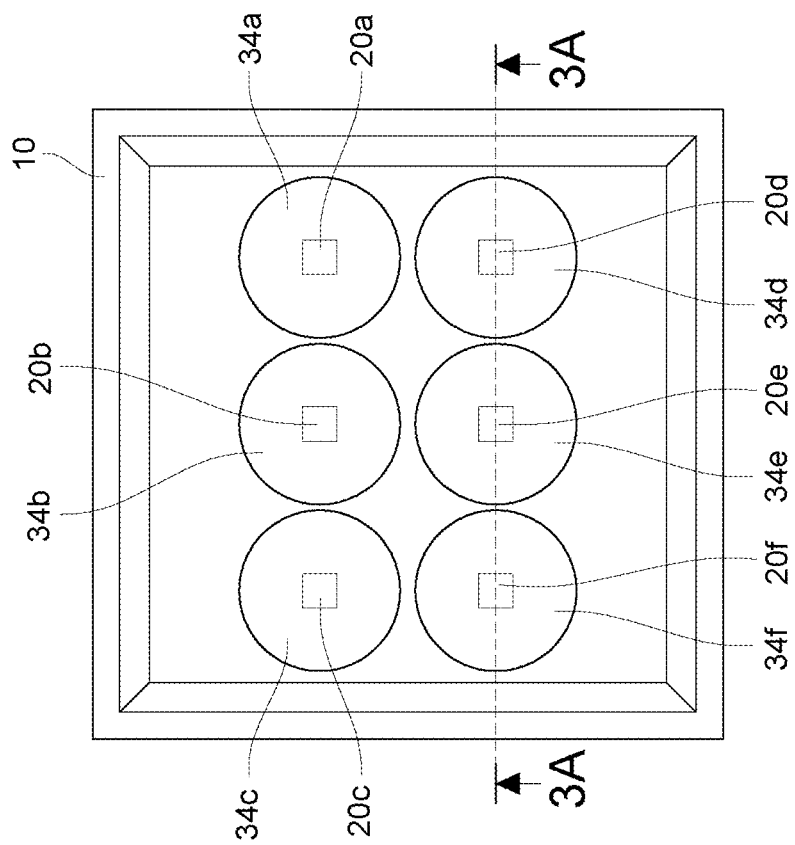
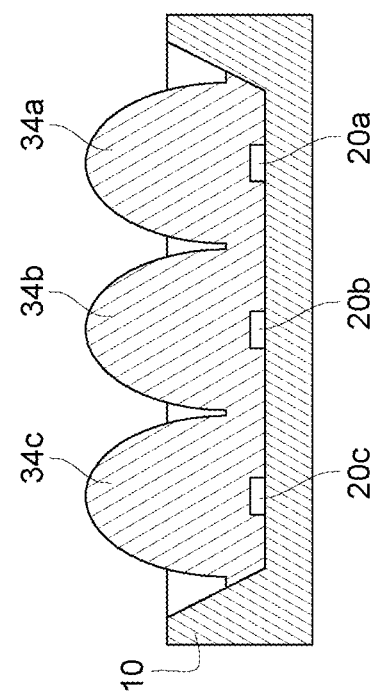
FIG.3B
FIG.3A

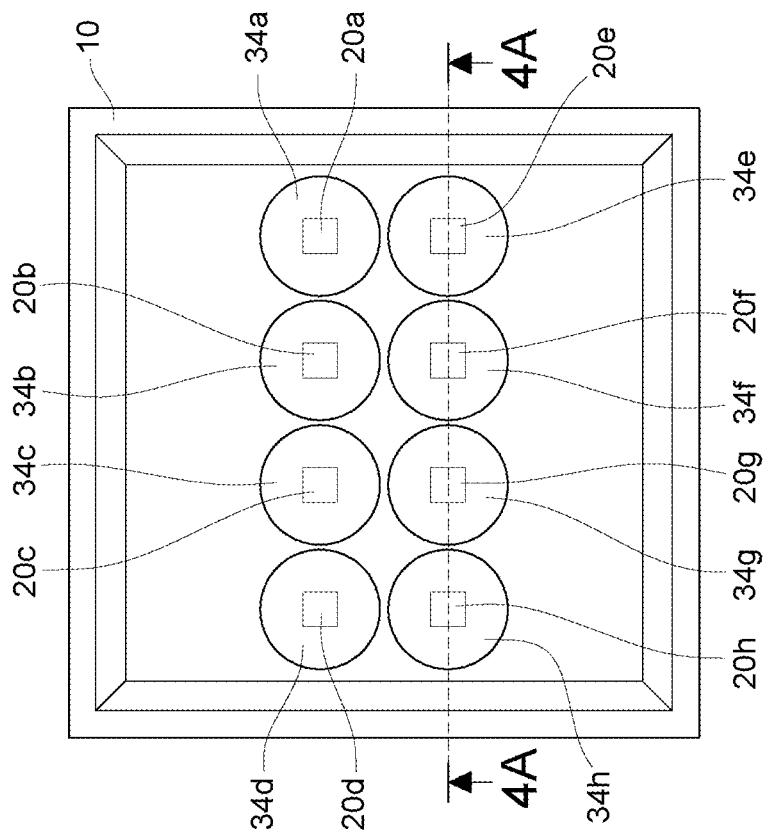
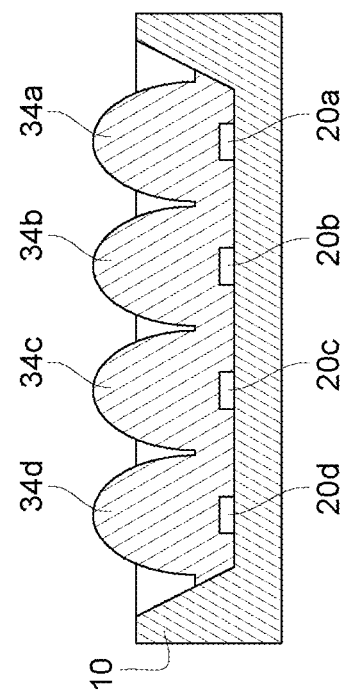
FIG.4B
FIG.4A

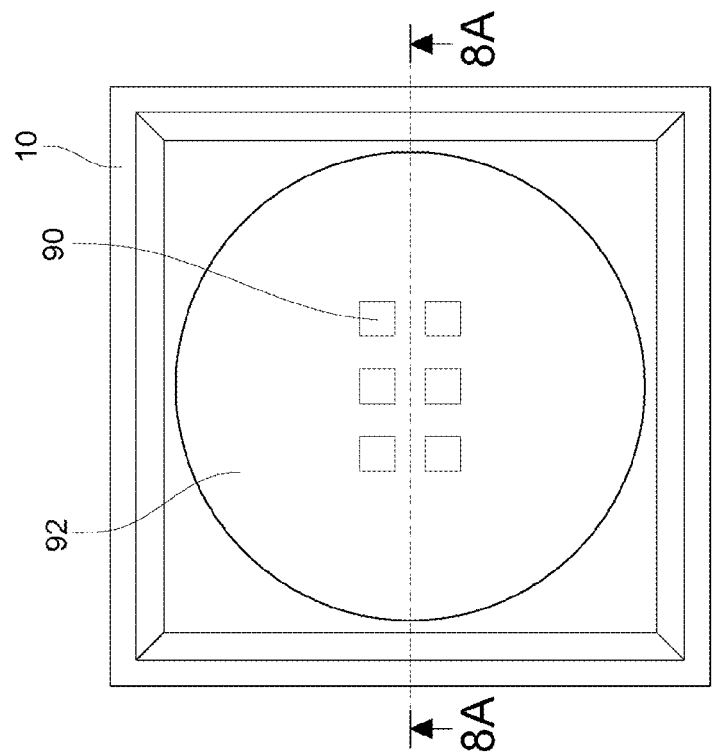
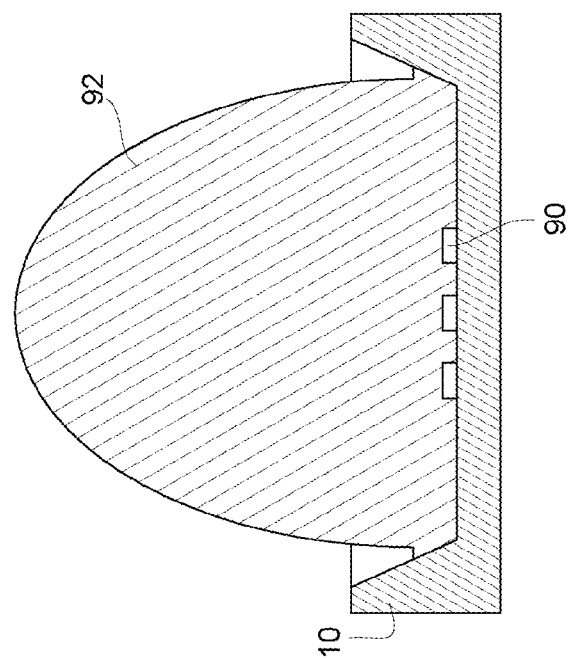
FIG.8B
FIG.8A

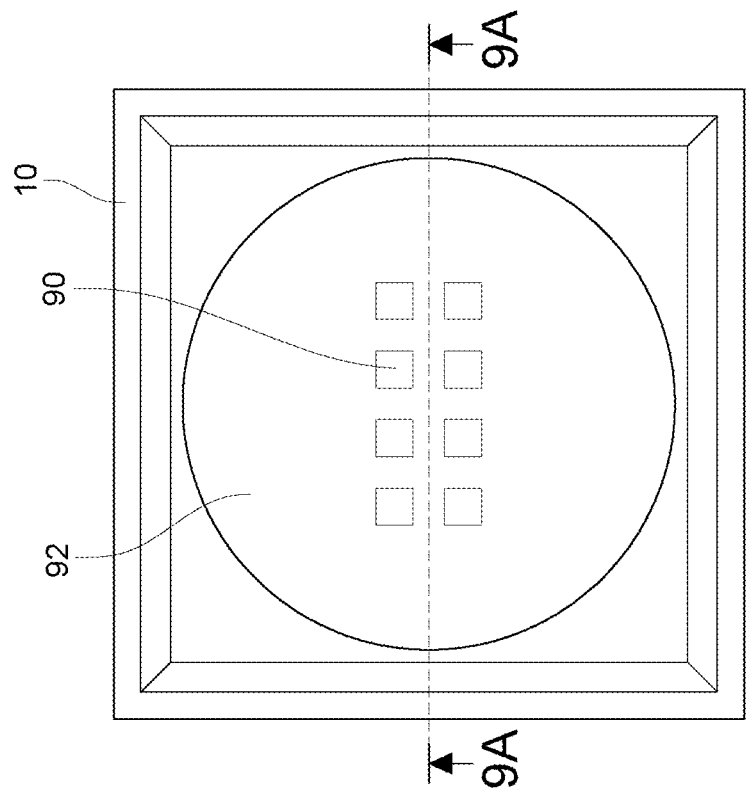
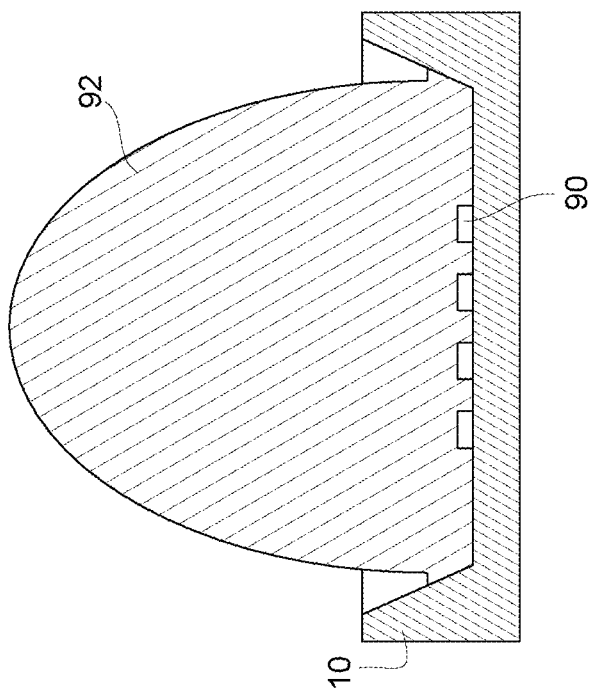

MULTICHIP LIGHT-EMITTING DIODE HAVING MULTIPLE LENSES

CROSS-REFERENCE TO RELATED APPLICATIONS

This non-provisional application claims priority under 35 U.S.C.§119(a) on patent application Ser. No(s). 097150508 filed in Taiwan, R.O.C. on Dec. 24, 2008.

BACKGROUND OF THE INVENTION

1. Field of Invention

The present invention relates to a light-emitting diode (LED), and more particularly to a multichip LED including a plurality of light-emitting chips each having a lens disposed in a reflective cup.

2. Related Art

Persons in the industry have been making great efforts to enhance the light efficiency of LEDs. The light efficiency may be classified briefly into intrinsic efficiency and extrinsic efficiency. The intrinsic efficiency refers to an intrinsic efficiency inside a chip, and the extrinsic efficiency refers to a ratio of the efficiencies before and after the light passes a lens.

Generally, the LED includes a light-emitting chip and a package wrapped outside the chip. When a forward bias is applied on the LED, a PN junction of the chip emits light. The light is reflected and/or refracted inside the chip, and then passes through the chip surface. The light passing through the chip surface is irradiated to the outside after passing through the package. Here, the intrinsic light efficiency is a light efficiency of the light generated when the forward bias is applied on the chip before passing through the chip, and the extrinsic light efficiency is a light efficiency of the light after passing through the chip and before passing through the package. The present invention intends to improve the extrinsic light efficiency.

Patents involving extrinsic light efficiency include ROC Utility Model Patent No. M333027 entitled "High Light Efficiency Substrate of High Brightness LED" issued on May 21, 2008, which provides a high light efficiency substrate of a high brightness LED. The substrate is provided with a primary concave cup, a plurality of secondary concave cups is disposed inside the primary concave cup, a reflective layer is coated on walls of the secondary concave cups and the primary concave cup, and LEDs are disposed on bottoms of the secondary concave cups respectively. Thus, the light emitted by the LEDs will not interfere with and neutralize each other, such that the emitted light is irradiated to the outside completely, which improves the light efficiency, and does not cause accumulated heat easily.

ROC Utility Model No. 568358 issued on Dec. 21, 2003 has disclosed a package structure of multichip LED, in which a plurality of red, green, and blue LED chips are directly bonded on a silicon substrate of a control IC, and the control IC is attached on a carrier. Thus, the size of the structure is reduced, and the heat dissipation is improved. Further, each chip is directly driven and controlled by the control IC, so the carrier to which the package structure is attached is not limited to be a printed circuit board, but may be any available solid material.

ROC Invention Patent No. 1237406 issued on Aug. 1, 2005 has disclosed a high brightness LED, in which conducting terminals with different polarities and a bearing part is disposed inside a transparent insulator, a chip is fixed to the bearing part, a fluorescent material is disposed at a periphery of the chip, and an electrode layer formed by gold wires of the chip is connected to the conducting terminals. A side of the bearing part disposed with the chip has a reflective layer for reflecting a light source of the chip toward the outside of the transparent insulator, so as to enhance the brightness of the LED.

ROC Utility Model Patent No. M270497 issued on Jul. 11, 2005 has disclosed a multichip LED package structure and a light source using the package structure. The multichip LED package structure includes an insulating plane and a plurality of conducting finger pairs. Each conducting finger pair is transversely arranged on an upper surface of the insulating plane. Each conducting finger pair includes a first conducting finger and a second conducting finger with opposite finger tips. An LED chip is disposed on the first conducting finger, and is electrically connected to the second conducting finger through a wire. Meanwhile, the first conducting fingers of the conducting finger pairs are located beside the second conducting fingers of the neighboring conducting finger pairs in parallel.

The patents described above have a package for packaging the chip. ROC Utility Model Patent No. M294718 issued on Jul. 21, 2006 has disclosed an application of the LED having a package. This patent is an improved structure of a traffic light, which mainly includes at least a set of LED light groups arranged in a square matrix or a round disposed in a traffic signal box. Each LED light in the LED light group is a multichip LED, which at least includes a red and a green light-emitting chip to emit red, green, and yellow light. When the structure is used in combination, the traffic light may display a traffic light signal of red, green, or yellow according to the control of traffic signals. Thus, one light may be used to display three colors, which reduces the weight and area of the traffic light, and reduces the cost for installation and maintenance.

It can be known from above that the LED having a package has various applications in the industry. However, the improvement of the extrinsic efficiency is still a task for persons in the industry to research.

SUMMARY OF THE INVENTION

Accordingly, the present invention is a multichip LED, which improves the extrinsic efficiency.

The multichip LED of the present invention comprises a reflective cup, a plurality of light-emitting chips, and a package. The light-emitting chips are disposed in the reflective cup, and emit light when the light-emitting chips are driven. The package is disposed in the reflective cup and covers the light-emitting chips. The package comprises a plurality of lenses. The lenses are corresponding to the light-emitting chips. The lenses respectively refract light emitted by the corresponding light-emitting chips.

The reflective cup includes a bearing surface and a reflective surface. The light-emitting chips are disposed on the bearing surface. The reflective surface reflects the light irradiated on the reflective surface. The package comprises a conducting layer. The conducting layer is disposed in the reflective cup and between the lenses and the chips. The conducting layers wrap the light-emitting chips.

The light-emitting chips are evenly distributed on the bearing surface. Each of the lenses has a curved surface. The curved surfaces are substantially the same. Each of the lenses is contact with the conducting layer and a connecting interface is sandwiched between the lenses and the conducting layer. The neighboring connecting interfaces are substantially and partially contact with each other.

The curved surface of each of the lenses complies with the following surface equation:

$$Z(x) = \frac{R \cdot x^2}{1 + \sqrt{(1-(1+K)R^2 x^2)}}, -1 \le K \le 1$$

where, x is a vertical distance between each point on the curved surface and an optical axis of the light-emitting chip, R is a central curvature of the curved surface, K is a conic constant, and Z(x) is an axial height when the vertical distance between the curved surface and the optical axis is x.

The bearing surface has a plurality of concave cups. The concave cups are corresponding to the light-emitting chips, and respectively bear the corresponding light emitting chips. A distance between an upper surface of one of the light-emitting chips and an upper surface of the conducting layer is different from distances between upper surfaces of other light-emitting chips and the upper surface of the conducting layer.

The multichip LED of the present invention (a) increases the area that the lenses cover the light emitted by the corresponding light-emitting chips by adjusting the thickness of the conducting layer properly, that is, enables more light emitted from the light-emitting chips to enter (the connecting interfaces (joining interfaces) of) the corresponding lenses, and (b) achieves better extrinsic light efficiency by properly adjusting the surface equation of the curved surfaces of the lenses to comply with beam profiles of the light-emitting chips corresponding to the lenses.

As for features and examples of the present invention, an embodiment will be illustrated in detail with reference to the accompanying drawings.

The description on the content of the present invention above and the description on the embodiments below are used to exemplify and explain the spirit and principle of the present invention, and provide further explanation on the claims of the present invention.

BRIEF DESCRIPTION OF THE DRAWINGS

The present invention will become more fully understood from the detailed description given herein below for illustration only, and thus are not limitative of the present invention, and wherein:

FIGS. 1A and 1B are schematic structural views of the multichip LED according to a first embodiment of the present invention;

FIGS. 3A and 3B are schematic structural views of the multiple LED according to a third embodiment of the present invention;

FIGS. 4A and 4B are schematic structural views of the multiple LED according to a fourth embodiment of the present invention;

FIGS. 8A and 8B are schematic structural views of the reference group corresponding to the third embodiment of FIGS. 3A and 3B;

FIGS. 9A and 9B are schematic structural views of the reference group corresponding to the fourth embodiment of FIGS. 4A and 4B;

DETAILED DESCRIPTION OF THE INVENTION

Figure 2:
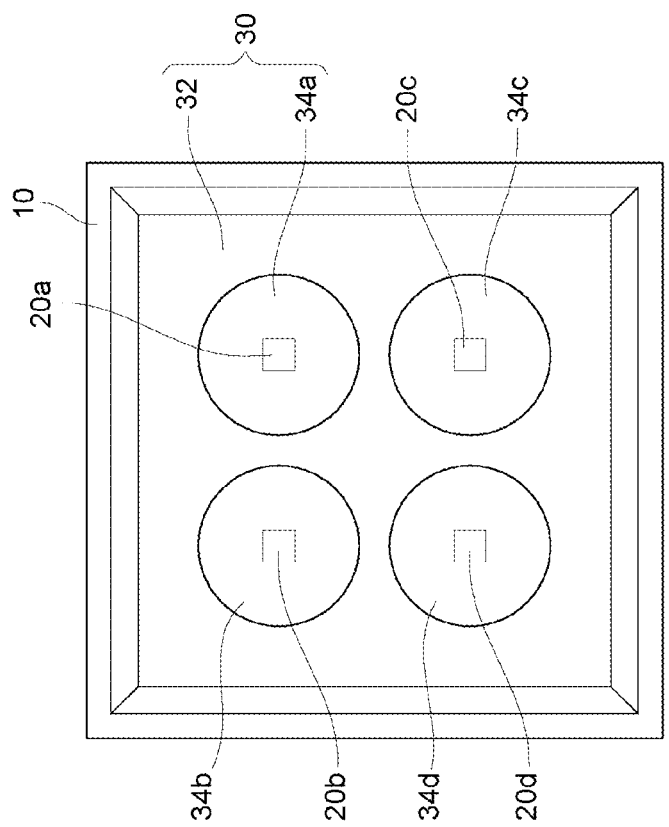
FIG. 2 is a schematic structural view of the multichip LED according to a second embodiment of the present invention.

Detailed features and advantages of the present invention are described in the embodiments below, and their content is adequate for those skilled in the art to understand the technical content of the present invention and to implement the present invention. According to the content disclosed in the specification, the claims, and the drawings, those skilled in the art can easily understand the objects and advantages of the present invention.

FIGS. 1A and 1B are schematic structural views of the multichip LED according to a first embodiment of the present invention. FIG. 1B is a top view of the first embodiment, and FIG. 1A is a cross-sectional view taken along 1A-1A of FIG. 1B. It can be seen from the figures that, the multichip LED comprises a reflective cup 10, a plurality of light-emitting chips 20a, 20b, and a package 30.

The light-emitting chips 20a, 20b are disposed in the reflective cup 10. The light-emitting chips 20a, 20b emit light when driven (applied with electrical current).

The package 30 is disposed in the reflective cup 10 and covers the light-emitting chips 20a, 20b. The package 30 has a plurality of lenses 34a, 34b. The lenses 34a, 34b are respectively corresponding to the light-emitting chips 20a, 20b one by one. Each lens 34a, 34b refracts the light emitted from the corresponding light-emitting chip 20a, 20b respectively. Taking FIG. 1A for example, the lens 34a refracts the light emitted by the light-emitting chip 20a (towards the top of FIG. 1A), the lens 34b refracts the light emitted by the light-emitting chip 20b. The lenses 34a, 34b mainly refract the light emitted from the corresponding light-emitting chips 20a, 20b, but when the light emitted by the non-corresponding light-emitting chips 20b, 20a is irradiated on the lenses 34a, 34b, the lenses 34a, 34b also reflect the light. That is, the depiction that "the lenses 34a, 34b reflect the light emitted by the corresponding light-emitting chips 20a, 20b" is for illustration of major function of the lenses 34a, 34b, but not a limitation (to the claims).

The reflective cup 10 has a bearing surface 12 and a reflective surface 14. The bearing surface 12 bears the light-emitting chips 20a, 20b. The reflective surface 14 reflects the light irradiated on the reflective surface 14.

It can be seen from FIG. 1B that, the reflective cup 10 is square (in the top view). But the shape of the reflective cup 10 is not limited to this. The shape of the reflective cup 10 in the top view may also be, but is not limited to, round, rectangle, or ellipse.

Referring to FIGS. 1A and 1B, the package 30 further has a conducting layer 32 (light conducting layer). The conducting layer 32 is disposed in the reflective cup 10 and between the lenses 34a, 34b and the light-emitting chips 20a, 20b. The conducting layer 32 wraps (covers) the light-emitting chips 20a, 20b and conducts the light emitted by the light-emitting chips 20a, 20b. The conducting layer 32 has a thickness d. The reflective cup 10 has a depth D. The depth D of the reflective cup 10 is greater than the thickness d of the conducting layer 32. The light-emitting chips 20a, 20b are allocated symmetrically on the bearing surface 12. The light-emitting chips 20a, 20b may also be disposed evenly (distributed) on the bearing surface 12, thereby increasing the distance between the light-emitting chips 20a, 20b. In the design, the distance between the lenses 34a, 34b and the light-emitting chips 20a, 20b may be shortened by adjusting the thickness d of the conducting layer 32. Thus, the lenses 34a, 34b may receive more light emitted by the corresponding light-emitting chips 20a, 20b to obtain better light efficiency.

In other words, a connecting interface 36a, 36b (the joining interface shown in figures by dashed lines) is sandwiched between each lens 34a, 34b and the conducting layer 32. The less the thickness d is, the closer the neighboring connecting interfaces 36a, 36b will be. When the neighboring connecting interfaces 36a, 36b are substantially and partially contact with each other, the rate of the light received by the lenses 34a, 34b from the corresponding light-emitting chips 20a, 20b is highest. Here, the lenses 34a, 34b and the connecting interfaces 36a, 36b almost occupy most of the light receiving angle α of the corresponding light-emitting chips 20a, 20b. The angle at which the lenses 34a, 34b receive the light of the light-emitting chips 20a, 20b is defined as the light receiving angle α. The bigger the light receiving angle α is, the higher the overall light efficiency is. By increasing the distance between the light-emitting chips 20a, 20b or decreasing the thickness d of the conducting layer 32, the light receiving angle α will be expanded. The user may also adjust the correspondence between them properly to obtain good light efficiency.

Though better extrinsic light efficiency may be obtained by adjusting the distance between the light-emitting chips 20a, 20b and the thickness of the conducting layer 32, to obtain more economical and high light efficiency LED, the limitation of process must also be considered.

The lenses 34a, 34b each have a curved surface 35a, 35b corresponding to light-emitting chips 20a, 20b with the same property. The curved surfaces 35a, 35b are substantially the same, and the curved surfaces 35a, 35b are convex lens surfaces for example. In order to improve the overall light efficiency, the surface equation of the curved surfaces 35a, 35b must be designed according to beam profiles of different light-emitting chips 20a, 20b. The surface equation of the curved surfaces 35a, 35b is illustrated as below:

The lenses 34a, 34b are corresponding to the light-emitting chips 20a, 20b, and the central axis of the lenses 34a, 34b substantially overlaps the optical axis 22a of the light-emitting chips 20a, 20b. The curved surfaces of the lenses 34a, 34b are substantially symmetric about the optical axis 22a. The vertical distance between each point on the curved surface 35a, 35b and the optical axis 22a is x, and the maximum vertical distance between the curved surfaces 35a, 35b and the optical axis 22a is r, so r is a half of the distance between the lenses 34a, 34b. The width of a top surface of the conducting layer 32 is L (taking the horizontal direction of FIG. 1A for example). n is the number of the lenses in the direction of width L. Taking FIG. 1A for example, n is 2. Therefore, if the neighboring lenses 34a, 34b is connected to each other, r=L/2n. Taking FIG. 1A for example, because the neighboring lenses 34a, 34b are not connected to each other, x≤r. The surface equation of the curved surfaces 35a, 35b is as follows:

$$Z(x) = \frac{R \cdot x^2}{1 + \sqrt{(1-(1+K)R^2x^2)}}, -1 \leq K \leq 1$$

where, Z(x) is the axial height when the vertical distance between the curved surfaces 35a, 35b and the optical axis is x. The axial height Z(x) is calculated upward when the connecting interface 36a, 36b between the curved surface 35a, 35b and the conducting layer 32 is considered as a point of origin. R is the central curvature of the curved surfaces 35a, 35b. K is a conic constant. When $-1<K<0$, the curved surfaces 35a, 35b are elliptical surfaces. When K=0, the curved surfaces 35a, 35b are sphere. When $0<K<1$, the curved surfaces 35a, 35b are oblate ellipses.

For example, in the present invention, the light-emitting chips 20a, 20b may be chips with different sizes, and their beam profiles may be slightly different. Therefore, different radii of curvature and conic constants may be used in the corresponding surface equation to adjust the distribution of the emitted light.

Regarding the selection of the central curvature and the K value, for example, in the embodiment of FIGS. 1A and 1B, the light-emitting chips 20a, 20b are 15 mil chips. The central curvature is about 0.4, and the K value is about −0.65. However, the K value and the R value may be adjusted according to the irradiation angle. The R value may be between 0.2 and 0.75. Furthermore, in the embodiment of FIG. 2, four same light-emitting chips 20a, 20b, 20c, and 20d are used, the R value may also be 0.4, and the K value is still −0.65. For example, in the embodiment of FIGS. 3A and 3B, six same light-emitting chips 20a, 20b, 20c, 20d, 20e, and 20f are used, the R value is adjusted to 0.35, and the rest parameters may be adjusted according to the irradiation angle. For example, in the embodiment of FIGS. 4A and 4B, eight same light-emitting chips 20a, 20b, 20c, 20d, 20e, 20f, 20g, and 20h are used, the R value is adjusted to 0.26, and the rest parameters are adjusted according to the irradiation angle.

FIG. 2 is a schematic structural view (viewed from the top) of the multichip LED according to the second embodiment of the present invention. Referring to FIG. 2, the multichip LED includes a reflective cup 10, four light-emitting chips 20a, 20b, 20c, 20d, and four lenses 34a, 34b, 34c, 34d. The second embodiment is the same as the first embodiment except the number of the light-emitting chips 20a, 20b, 20c, 20d and the lenses 34a, 34b, 34c, 34d, and will not be described in detail here.

FIG. 3B is a top view according to a third embodiment of the present invention, and FIG. 3A is a cross-sectional view taken along 3A-3A of FIG. 3B. Referring to FIGS. 3A and 3B, it can be seen from the figures that, the multichip LED includes a reflective cup 10, six light-emitting chips 20a, 20b, 20c, 20d, 20e, 20f and six lenses 34a, 34b, 34c, 34d, 34e, 34f. FIG. 4B is a top view according to a fourth embodiment of the present invention, and FIG. 4A is a cross-sectional view taken along 4A-4A of FIG. 4B. Referring to FIGS. 4A and 4B, it can be seen from the figures that, the multichip LED includes a reflective cup 10, eight LED 20a, 20b, 20c, 20d, 20e, 20f, 20g, 20h, and eight lenses 34a, 34b, 34c, 34d, 34e, 34f, 34g, 34h. The embodiments are similar to the first embodiment, and only the number of the light-emitting chips 20a, 20b, 20c, 20d, 20e, 20f, 20g, 20h and the number of the lenses 34a, 34b, 34c, 34d, 34e, 34f, 34g, 34h are different, so the embodiments will not be described in detail here.

Figure 5:
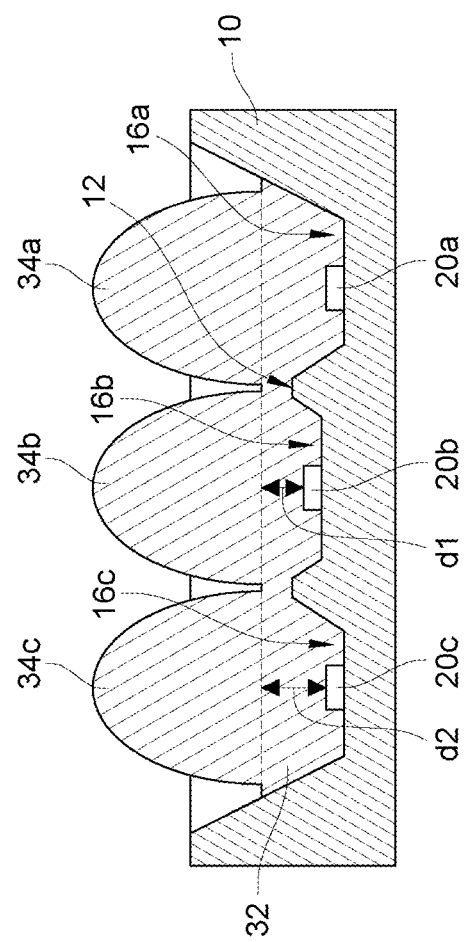
FIG. 5 is a schematic structural view of the multiple LED according to a fifth embodiment of the present invention.

FIG. 5 is a schematic structural view of the multichip LED according to a fifth embodiment of the present invention. Referring to FIG. 5, the bearing surface 12 of the reflective cup 10 has a plurality of concave cups 16a, 16b, 16c, and each concave cup 16a, 16b, 16c is corresponding to each light-emitting chip 20a, 20b, 20c. The conducting layer 32 fills in the reflective cup 10 and covers the light-emitting chips 20a, 20b, 20c. The distance d1 between the upper surface of the light-emitting chip 20b and the upper surface of the conducting layer 32 is different from the distance d2 between upper surfaces of other light-emitting chips 20a, 20c and the upper surface of the conducting layer 32. Thus, the design of the curved surface of the corresponding lens 34b is also slightly different, and the light receiving effect is also different. This design may also achieve the objectives of the present invention.

Figure 6B:
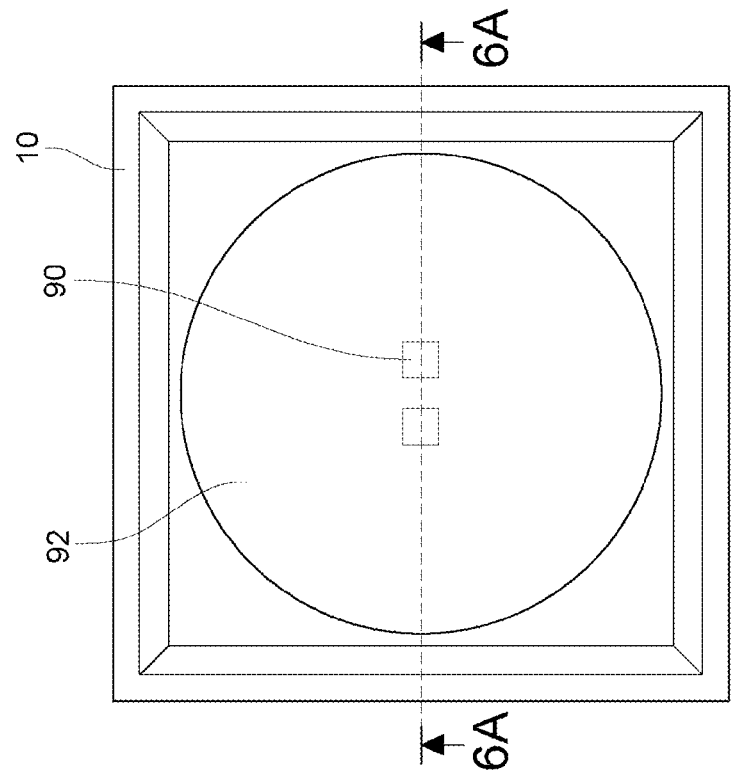
FIGS. 6A and 6B are schematic structural views of the reference group corresponding to the first embodiment of FIGS. 1A and 1B.
Figure 6A:
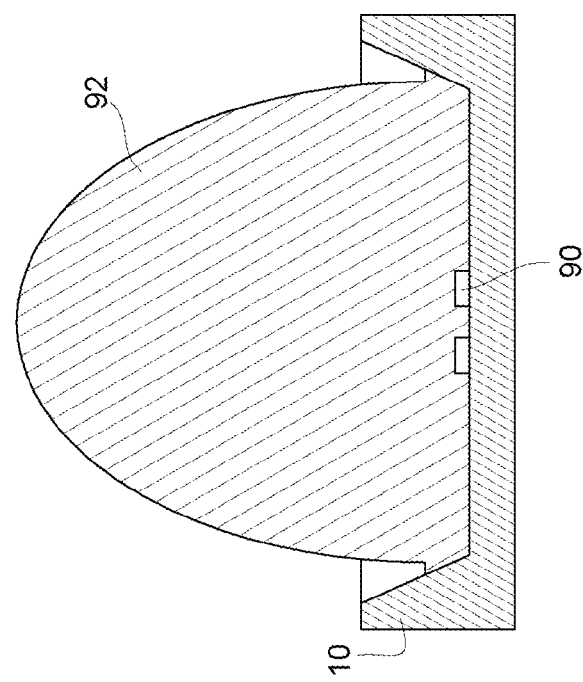
Figure 7:
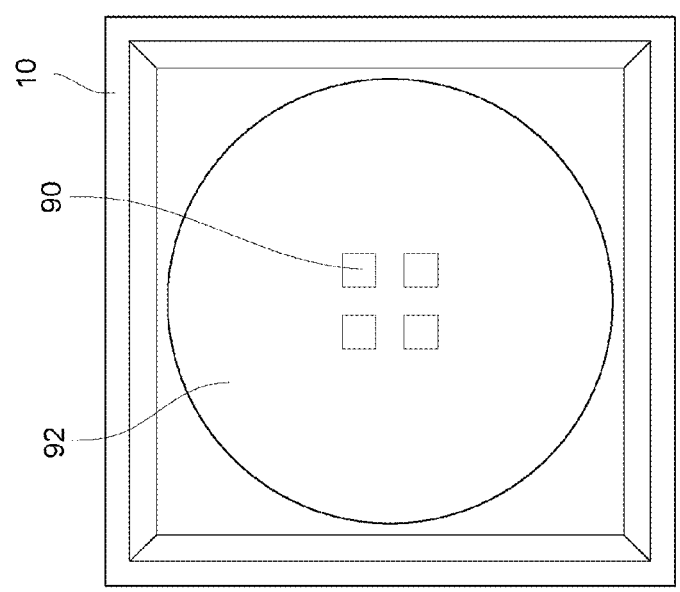
FIG. 7 is a schematic structural view of the reference group corresponding to the second embodiment of FIG. 2.

For the light efficiency of the first to the fourth embodiments of the present invention, a light efficiency experiment of a reference group is carried out. In the reference group, the multiple light-emitting chips are disposed in the same reflective cup, but a single lens is used. FIGS. 6A and 6B are schematic structural views corresponding to the reference group of the first embodiment of FIGS. 1A and 1B. The reference group has two light-emitting chips 90 and a single lens 92. FIG. 7 is a schematic structural view corresponding to the reference group of the second embodiment of FIG. 2. The reference group has four light-emitting chips 90 and a single lens 92. FIGS. 8A and 8B are schematic structural views corresponding to the reference group of the third embodiment of FIGS. 3A and 3B. The reference group has six light-emitting chips 90 and a single lens 92. FIGS. 9A and 9B are the schematic structural views corresponding to the reference group of the fourth embodiment of FIGS. 4A and 4B. The reference group has eight light-emitting chips 90 and a single lens 92.

Figure 10A:
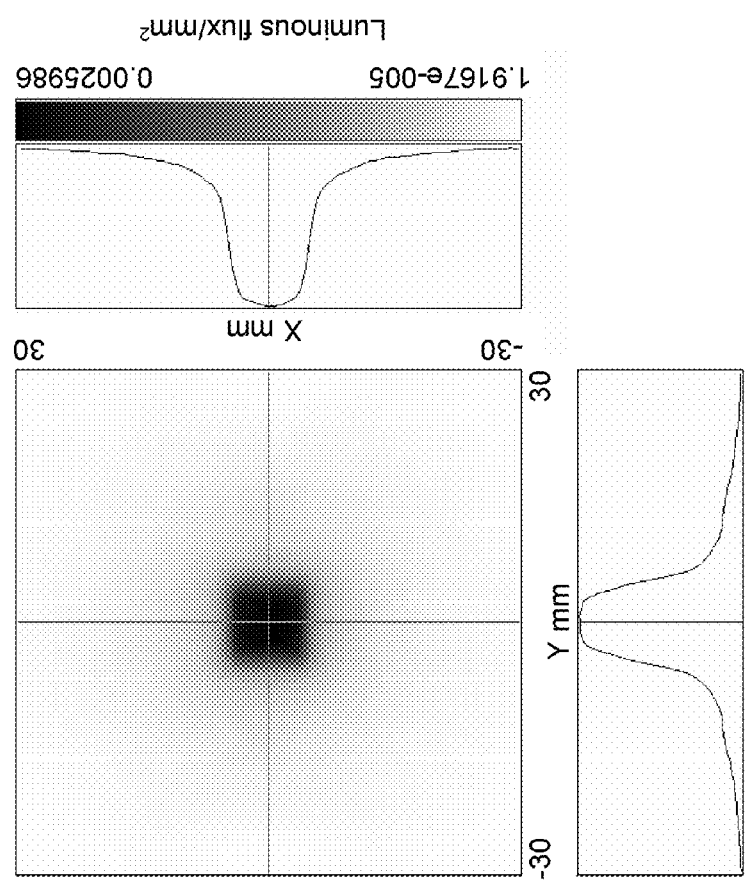
FIGS. 10A and 10B are luminous intensity distribution diagrams of the first embodiment of the present invention and the experiment reference group thereof.
Figure 10B:
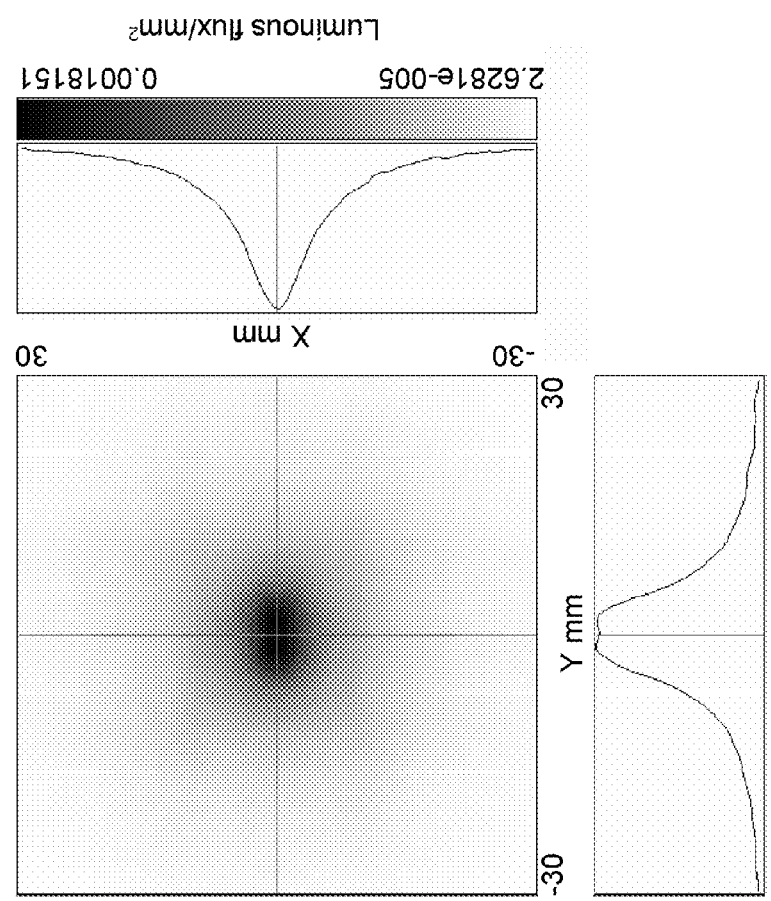

FIGS. 10A and 10B show the distribution of the emitted light of the first embodiment and the reference group thereof. FIG. 10A is a distribution diagram of the emitted light of the first embodiment. FIG. 10B is distribution diagram of the emitted light of the reference group (FIGS. 6A and 6B) of the first embodiment.

In the distribution diagrams of the emitted light, a specific height above the first embodiment and the reference group thereof is defined as a detector plane. The light from the first embodiment and the reference group thereof is collected on the plane respectively to produce FIGS. 10A and 10B. Each distribution diagram of the emitted light (also referred to as a light intensity distribution diagram) is divided into three pictures. For example, in FIG. 10A, the picture in the center is a plane intensity contour pattern of the light intensity received by the entire detector plane, that is, each point in the central picture represents the light intensity of the location of the point by color or grayscale. The pictures at the right side and below the distribution diagram of the emitted light are respectively the light intensity curves of the Y (vertical) and X (horizontal) location crossing the center of the central picture. When the light intensity curves at the right side and left side in the peak area are more horizontal, it indicates that the high light emitting area is more uniform. When the peak area is larger, it indicates that the uniform area is larger.

Figure 11A:
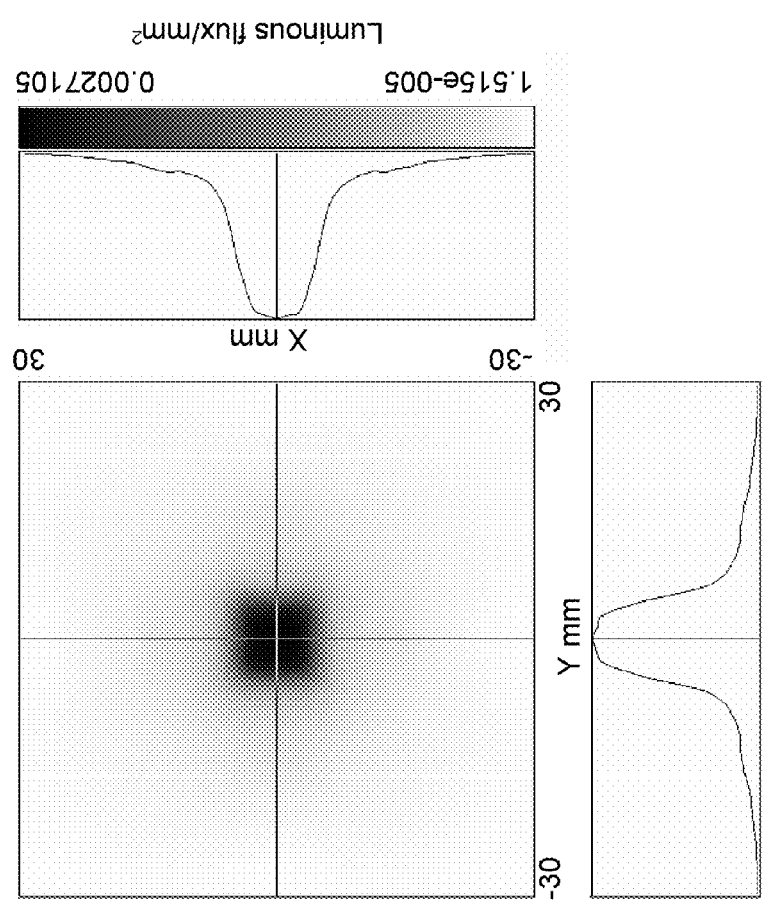
FIGS. 11A and 11B are luminous intensity distribution diagrams of the second embodiment of the present invention and the reference group thereof.
Figure 11B:
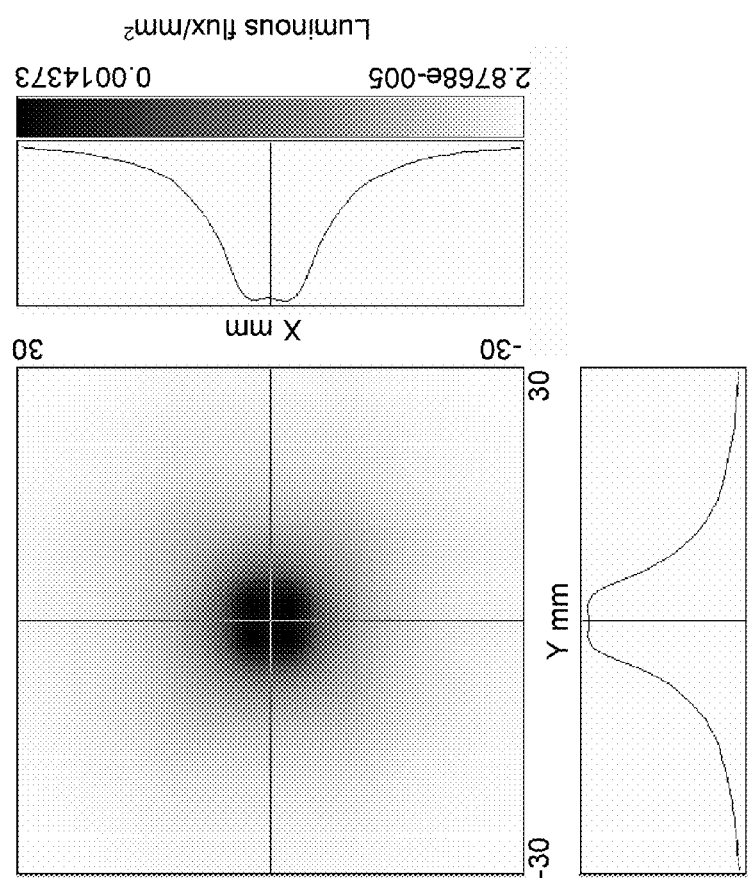

FIGS. 11A and 11B show distributions of the emitted light of the second embodiment and the reference group thereof. FIG. 11A is a distribution diagram of the emitted light of the second embodiment. FIG. 11B is a distribution diagram of the emitted light of the reference group (FIG. 7) of the second embodiment.

Figure 12A:
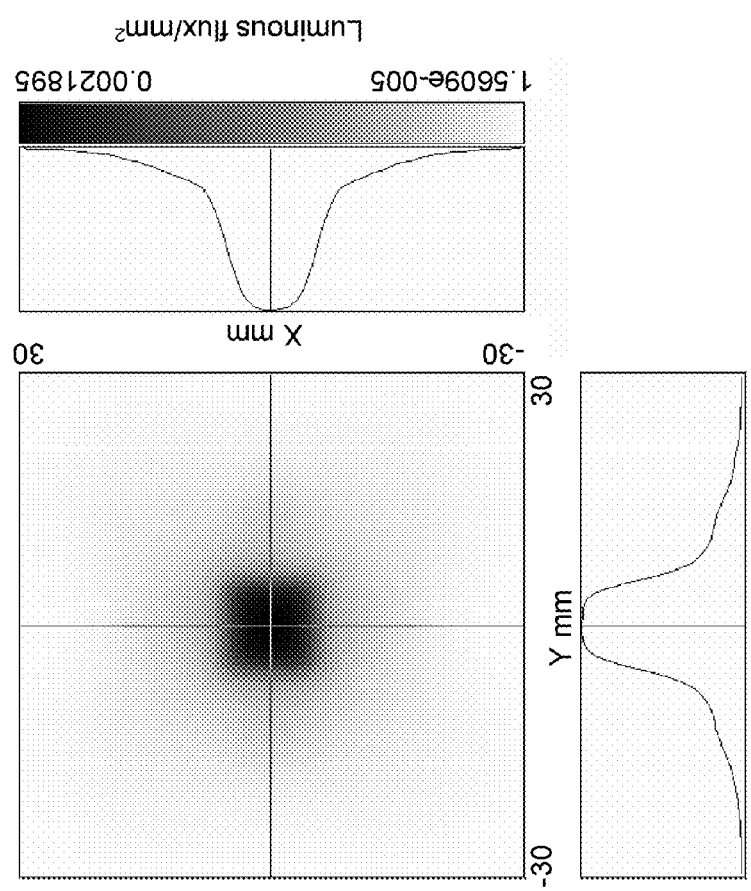
FIGS. 12A and 12B are luminous intensity distribution diagrams of the third embodiment of the present invention and the reference group thereof.
Figure 12B:
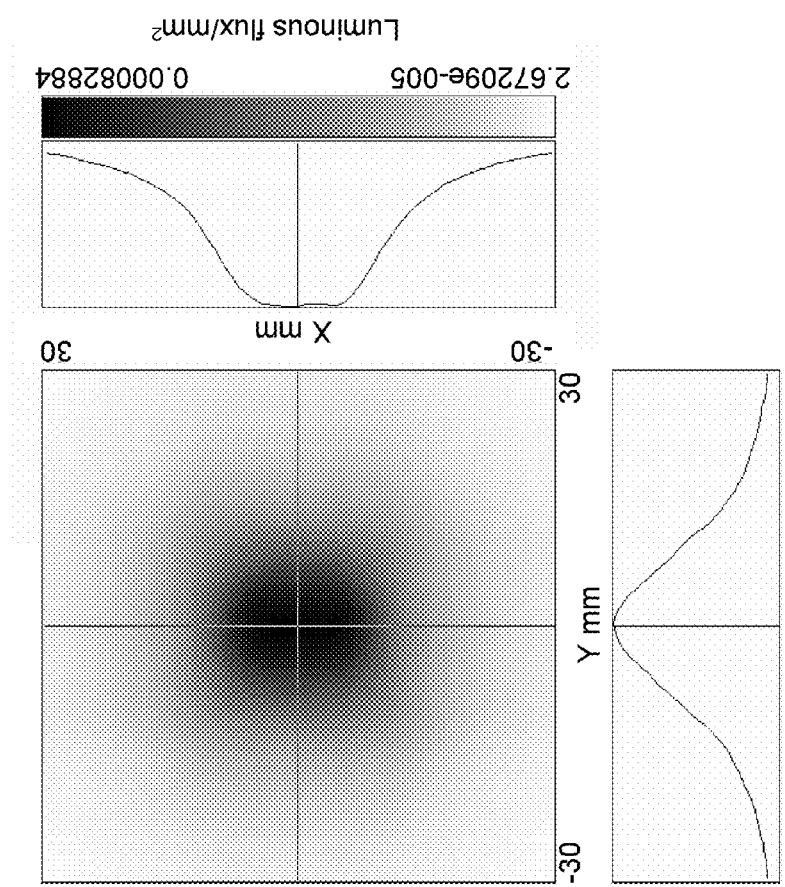

FIGS. 12A and 12B show distributions of the emitted light of the third embodiment and the reference group thereof. FIG. 12A is a distribution diagram of the emitted light of the third embodiment. FIG. 121B is a distribution diagram of the emitted light of the reference group (FIGS. 8A and 8B) of the third embodiment.

Figure 13A:
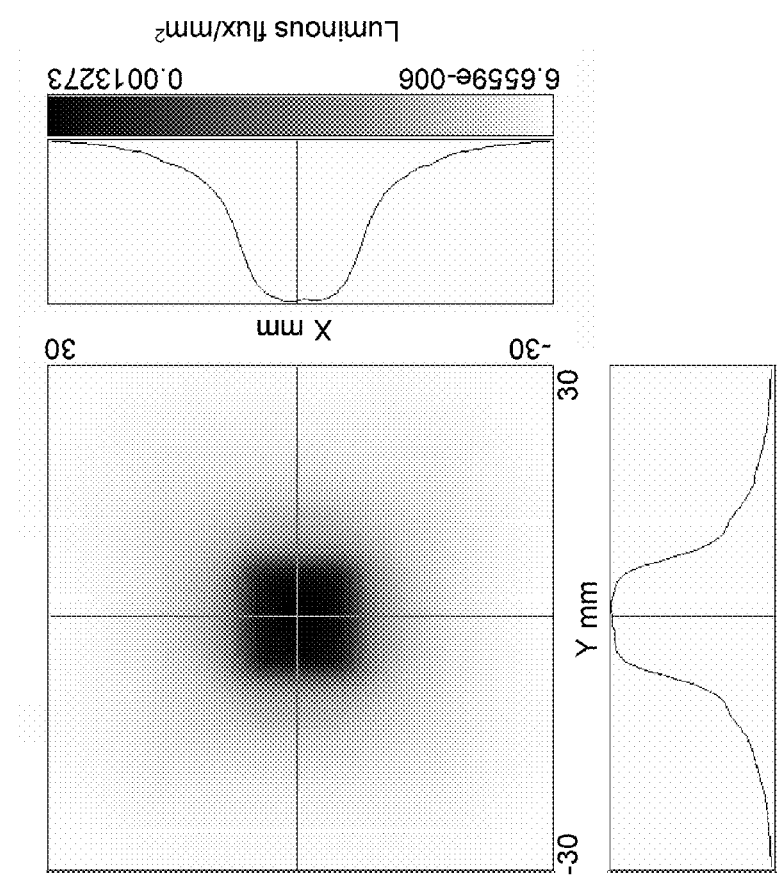
FIGS. 13A and 13B are luminous intensity distribution diagrams of the fourth embodiment of the present invention and the reference group thereof.
Figure 13B:
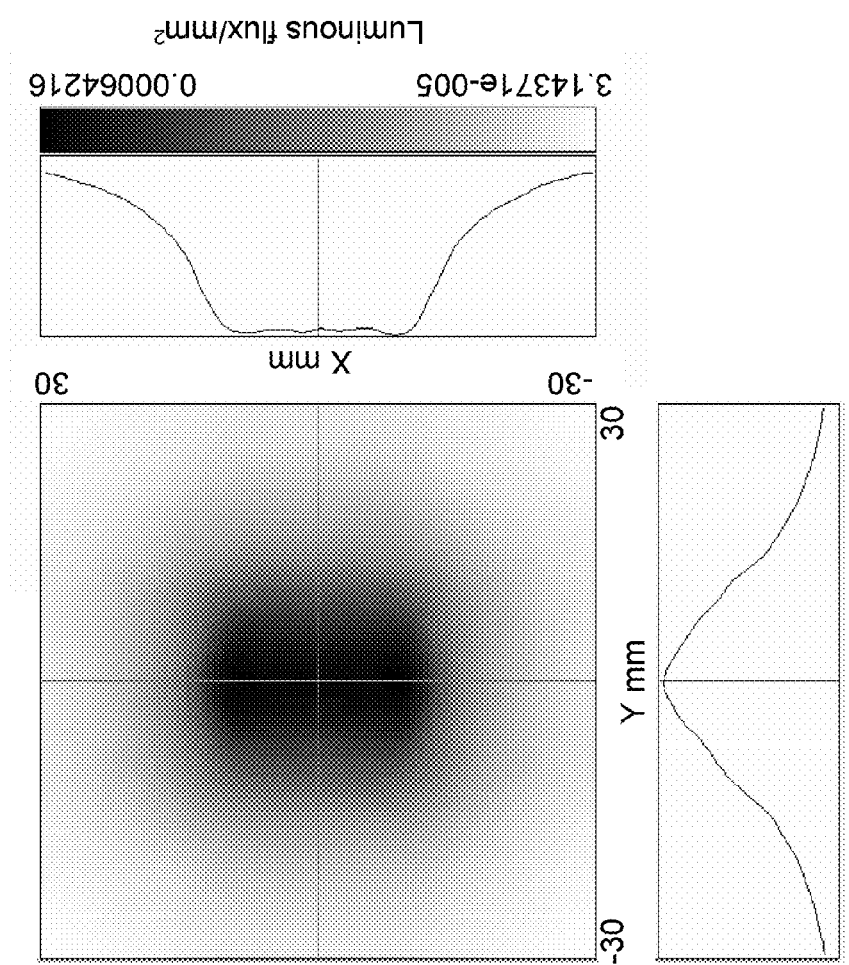

FIGS. 13A and 13B show distributions of the emitted light of the fourth embodiment and the reference group thereof. FIG. 13A is a distribution diagram of the emitted light of the fourth embodiment. FIG. 13B is a distribution diagram of the emitted light of the reference group (FIGS. 9A and 9B) of the fourth embodiment.

It can be seen from the distribution diagrams of the emitted light that the shape of the light emitted by the first to the fourth embodiments is close to the reflective cup and is more concentrated. Relatively, the shape of the light of the reference group is not concentrated, is highly associated with the arrangement of the light-emitting chips. Thus, it is easy for the present invention to control the light distribution.

At last, referring to the table below, the table below is an efficiency table of the first to the fourth embodiments and the reference groups, where the given total light emitting energy of the first to the fourth embodiments and the reference groups is 1 lumen, the detecting element is located at a height of 3 cm above the bearing surface 12, and the obtained highest illumination values (in lx) are in the table below.

|  | Number of Chips | | | | | | | |
|---|---|---|---|---|---|---|---|---|
|  | 2 | | 4 | | 6 | | 8 | |
|  | Characteristic | | | | | | | |
|  | Highest illumination | Light efficiency | Highest illumination | Light efficiency | Highest illumination | Light efficiency | Highest illumination | Light efficiency |
| Plane Conducting Layer | 181 | 0.303 | 182 | 0.309 | 177 | 0.315 | 205 | 0.321 |
| Single Lens | 1778 | 0.643 | 1371 | 0.626 | 826 | 0.615 | 624 | 0.631 |
| Multiple Lenses | 2584 | 0.732 | 2704 | 0.727 | 2189 | 0.719 | 1318 | 0.715 |

A first row in the efficiency table lists different numbers of the light-emitting chips in each experiment, that is, two, four, six and eight. A second row in the table is the characteristic in each experiment, that is, the highest illumination and the light efficiency. The highest illumination is the reading of the point in the distribution diagram with the highest intensity (in lux). The light efficiency is calculated by the ratio of the total luminous power of the LED with the package to that of the LED without the package, i.e., the value of the extrinsic light efficiency. For example, in the first embodiment, the LED (including a reflective cup and two light-emitting chips disposed in the reflective cup) without the package is disposed in an integrating sphere, and a predetermined electrical energy is applied thereon, the measured total luminous power is N min lumen (mlm). Then, the package of the first embodiment (having two corresponding lenses) is added on the same LED, and the LED is put in the integrating sphere for measurement to obtain a total luminous power of M mlm. The ratio between the two values is the light efficiency (M/N).

A third row of the efficiency table is a test carried out for the package only having the plane conducting layer. The package does not have the lenses, but has only the plane conducting layer. The number and the locations of the light-emitting chips are corresponding to the first to the fourth embodiments.

A fourth row of the efficiency table lists the reference group of FIGS. 6A, 6B, 7, 8A, 8B, 9A, 9B. A fifth row of the efficiency table lists the first to the fourth embodiments of FIGS. 1A, 1B, 2, 3A, 3B, 4A, 4B.

It can be known from the efficiency table that the overall efficiencies of the first to the fourth embodiments according to the present invention are all better than those of the reference groups. When two light-emitting chips are used, the highest illumination of the reference groups having only the plane conducting layer is 181 lx, and the highest illumination of the reference groups of the single lens is 1778 lx. Relatively, the highest illumination of the first embodiment of the present invention is 2584 lx. Obviously, the highest illumination of the first embodiment of the present invention is significantly better than the reference groups.

Referring to the efficiency table again, the light efficiency of the first embodiment of the present invention is up to 0.732, while that of the reference groups having the single lens is 0.643, and the reference groups having only the plane conducting layer is 0.303. It is understood clearly that, the light efficiency of the first embodiment of the present invention is nearly 10% higher than that of the reference group of the single lens, which is a significant advancement.

Regarding the highest illumination and the light efficiency of the second embodiment of the present invention, it can be known from the efficiency table that the second embodiment is better than the corresponding two reference groups. The third embodiment and the fourth embodiment also have the same effect.

The present invention is also compared with the reference groups having the same lens design but different number of light-emitting chips. In terms of a single lens, the highest illumination of two, four, six, and eight light-emitting chips decreases gradually, and the light efficiency also decreases. Therefore, by increasing only the number of the light-emitting chips, the overall light efficiency may probably be improved, but the light efficiency decreases, which is a significant conflict, and may lead to confusion of the industry in terms of applications. Relatively, in the multichip LED design of the present invention, though the highest illumination cannot be increased when the number of the light-emitting chips increases, the overall light efficiency still remains higher 70%, and a larger and more uniform light emitting area is obtained (as shown in FIGS. 10A, 11A, 12A, 13A), that is, the requirements and objectives of the industry are achieved.

What is claimed is:

1. A multichip light-emitting diode (LED), comprising:
a reflective cup;
a plurality of light-emitting chips, disposed in the reflective cup, and emitting light when driven; and
a package, disposed in the reflective cup and covering the plurality of light-emitting chips and having a plurality of lenses, said package comprising a conducting layer, the entire conducting layer disposed in the reflective cup and between the plurality of lenses and the plurality of light-emitting chips and the conducting layer wraps the plurality of light-emitting chips to conduct the light, said lenses extending above an upper surface of said reflective cup, wherein a depth of the reflective cup is greater than a thickness of the conducting layer;
wherein the plurality of lenses are corresponding to the plurality of light-emitting chips one by one and each of the plurality of lenses refracts light emitted from each of the plurality of light-emitting chips respectively, the reflective cup comprises a bearing surface and a reflective surface, the bearing surface bears the plurality of light-emitting chips, and the reflective surface reflects the light irradiated on the reflective surface, the curved surface of each of the plurality of lenses is a convex lens surface, the curved surface of each of the plurality of lenses complies with a following surface equation:

$$Z(x) = \frac{R \cdot x^2}{1 + \sqrt{(1 - (1 + K)R^2 x^2)}}, -1 \leq K \leq 1, \text{ and } 0.2 \leq R \leq 0.75;$$

wherein x is a vertical distance between each point on the curved surface and an optical axis of one of the plurality of light-emitting chips, R is a central curvature of the curved surface, K is a conic constant, Z(x) is an axial height when the vertical distance between the curved surface and the optical axis is x.

2. The multichip LED according to claim 1, wherein the plurality of light-emitting chips are distributed on the bearing surface evenly.

3. The multichip LED according to claim 1, wherein each of the plurality of lenses has a curved surface, and the curved surfaces are substantially the same.

4. The multichip LED according to claim 3, wherein each of the plurality of lenses is connected to the conducting layer with a connecting interface, and the connecting interfaces are substantially in contact with each other between the plurality of lenses.

5. The multichip LED according to claim 4, wherein the connecting interface is round.

6. The multichip LED according to claim 1, wherein the bearing surface comprises a plurality of concave cups, and the plurality of concave cups are corresponding to the plurality of light-emitting chips one by one and each of the plurality of concave cups bears one of the plurality of light-emitting chips.

7. The multichip LED according to claim 6, wherein each of the plurality of lenses is connected to the conducting layer with a connecting interface, and the connecting interfaces are substantially connected to each other between the plurality of lenses.

8. The multichip LED according to claim 7, wherein curved surfaces of the plurality of lenses are substantially the same.

9. The multichip LED according to claim 6, wherein a distance between an upper surface of one of the plurality of light-emitting chips and an upper surface of the conducting layer is different from distances between upper surfaces of other of the plurality of light-emitting chips and the upper surface of the conducting layer.

* * * * *